US010867685B2

(12) United States Patent
Parry et al.

(10) Patent No.: US 10,867,685 B2
(45) Date of Patent: *Dec. 15, 2020

(54) METHODS FOR DETECTING AND MITIGATING MEMORY MEDIA DEGRADATION AND MEMORY DEVICES EMPLOYING THE SAME

(71) Applicant: Micron Technology, Inc., Boise, ID (US)

(72) Inventors: Jonathan S. Parry, Boise, ID (US); George B. Raad, Boise, ID (US); James S. Rehmeyer, Boise, ID (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/846,049

(22) Filed: Apr. 10, 2020

(65) Prior Publication Data

US 2020/0243146 A1 Jul. 30, 2020

Related U.S. Application Data

(63) Continuation of application No. 16/591,414, filed on Oct. 2, 2019, now Pat. No. 10,643,717, which is a
(Continued)

(51) Int. Cl.
*G11C 7/00* (2006.01)
*G11C 16/34* (2006.01)
*G11C 11/406* (2006.01)

(52) U.S. Cl.
CPC ........ *G11C 16/3418* (2013.01); *G11C 11/406* (2013.01)

(58) Field of Classification Search
CPC ......... G11C 11/40611; G11C 11/40615; G11C 11/40618
See application file for complete search history.

(56) References Cited

U.S. PATENT DOCUMENTS 6,691,204 B1 2/2004 Roohparvar
10,115,448 B2 10/2018 Lee et al.
(Continued)

FOREIGN PATENT DOCUMENTS

KR 20080071499 A 8/2008

OTHER PUBLICATIONS

International Application No. PCT/US2019/020598—International Search Report and Written Opinion, dated Jun. 14, 2019, 12 pages.

*Primary Examiner* — Tuan T Nguyen
(74) *Attorney, Agent, or Firm* — Perkins Coie LLP

(57) ABSTRACT

Memory devices, system, and methods for operating the same are provided. The memory device can comprise a non-volatile memory array and control circuitry. The control circuitry can be configured to store a value corresponding to a number of activate commands received at the memory device, update the value in response to receiving an activate command received from a host device, and trigger, in response to the value exceeding a predetermined threshold, a remedial action performed by the memory device. The control circuitry can be further configured to store a second value corresponding to a number of refresh operations performed by the memory device, update the second value in response to performing a refresh operation, and trigger, in response to the value exceeding a second predetermined threshold, a second remedial action performed by the memory device.

25 Claims, 4 Drawing Sheets

Related U.S. Application Data continuation of application No. 15/933,678, filed on Mar. 23, 2018, now Pat. No. 10,475,519.

(56) References Cited

U.S. PATENT DOCUMENTS

| | | |
|---|---|---|
| 10,475,519 B2 | 11/2019 | Parry et al. |
| 2003/0133348 A1 | 7/2003 | Wong |
| 2008/0181017 A1 | 7/2008 | Watanabe et al. |
| 2008/0239808 A1* | 10/2008 | Lin ................. G06F 11/106 365/185.09 |
| 2008/0239851 A1* | 10/2008 | Lin ................. G11C 16/3431 365/222 |
| 2012/0033519 A1 | 2/2012 | Confalonieri et al. |
| 2012/0263003 A1 | 10/2012 | Sakakibara et al. |
| 2013/0132652 A1 | 5/2013 | Wood et al. |
| 2013/0262753 A1 | 10/2013 | Prins et al. |
| 2014/0192583 A1 | 7/2014 | Rajan et al. |
| 2016/0350178 A1 | 12/2016 | Lien et al. |
| 2018/0165024 A1 | 6/2018 | Baek et al. |
| 2019/0295666 A1 | 9/2019 | Parry et al. |
| 2020/0020384 A1* | 1/2020 | Zhao ................. G06F 13/18 |
| 2020/0035309 A1 | 1/2020 | Parry et al. |

* cited by examiner

METHODS FOR DETECTING AND MITIGATING MEMORY MEDIA DEGRADATION AND MEMORY DEVICES EMPLOYING THE SAME

CROSS-REFERENCE TO RELATED APPLICATION(S)

This application is a continuation of U.S. patent application Ser. No. 16/591,414, filed Oct. 2, 2019; which is a continuation of U.S. patent application Ser. No. 15/933,678, filed Mar. 23, 2018, now U.S. Pat. No. 10,475,519; each of which is incorporated herein by reference in its entirety.

TECHNICAL FIELD

The present disclosure generally relates to semiconductor memory devices, and more particularly relates to methods for detecting and mitigating memory media degradation and memory devices employing the same.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Many memory media are susceptible to various effects that can degrade their performance over time. For example, some memory technologies can experience degradation from wear (e.g., as a result of dielectric breakdown, material migration and the like) caused by changing the value of stored information (e.g., changing the amount of stored charge by adding and removing electrons from a charge trap, a floating gate, or a capacitor). Other memory technologies can experience imprint effects, in which maintaining a data state for an extended period of time can cause physical effects that make subsequently changing the data state or reliably storing a different data state in the same location more difficult. Accordingly, it is desirable to provide a way to mitigate these effects to increase the useful lifespan and performance of memory devices.

One approach to mitigating the degradation of memory media involves tracking, with a host device, the activities (e.g., read operations, write operations, erase operations, activate operations, etc.) or circumstances (e.g., device uptime, duration of data states, environmental conditions, etc.) that can cause degradation of a memory media. One drawback to this approach, however, is the amount of information about a memory media that would need to be communicated across a memory bus connecting the host and the memory device. Another drawback to this approach is the challenge posed when different types of memory media are connected to a single memory bus, especially different types of memory media that may experience different kinds of degradation in response to different activities and circumstances.

Accordingly, several embodiments of the present technology are directed to memory devices, systems including memory devices, and methods of operating memory devices and systems in which memory devices are configured to detect and mitigate memory media degradation independently of a memory host. In one embodiment, a memory device is provided, comprising a non-volatile memory array and control circuitry. The control circuitry is configured to store a value corresponding to a number of activate commands received at the memory device, to update the value in response to receiving an activate command received from a host device, and to trigger, in response to the value exceeding a predetermined threshold, a remedial action performed by the memory device.

Figure 1:
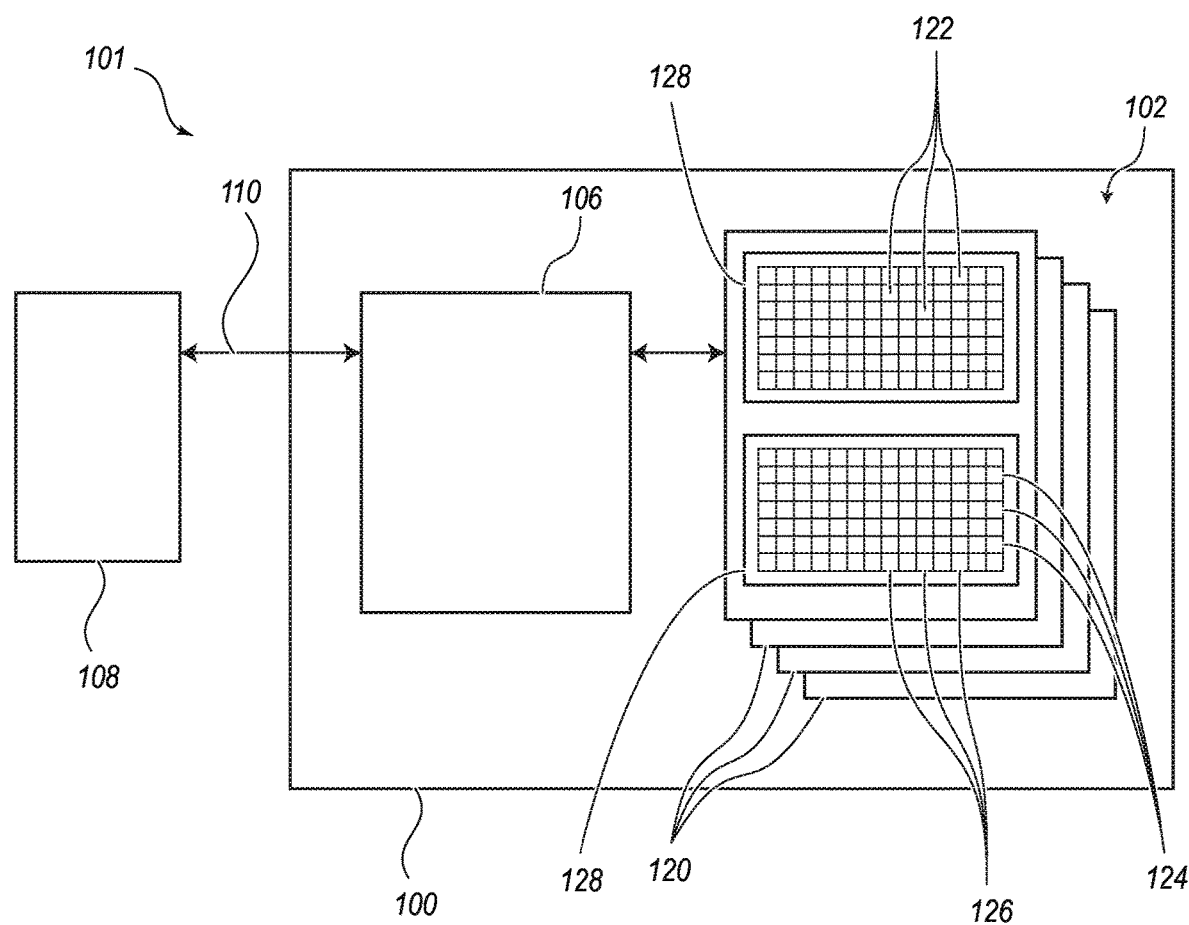
FIG. 1 is a block diagram schematically illustrating a memory device in accordance with an embodiment of the present technology.

FIG. 1 is a block diagram of a system 101 having a memory device 100 configured in accordance with an embodiment of the present technology. As shown, the memory device 100 includes a main memory 102 (e.g., DRAM, NAND flash, NOR flash, FeRAM, PCM, etc.) and control circuitry 106 operably coupled to a host device 108 (e.g., an upstream central processor (CPU)). The main memory 102 includes a plurality of memory regions, or memory units 120, which each include a plurality of memory cells 122. The memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages. The memory units 120 may, in some embodiments, also be sub-divided into memory regions 128 (e.g., banks, ranks, channels, blocks, pages, etc.).

The memory cells 122 can include, for example, floating gate, charge trap, phase change, capacitive, ferroelectric, magnetoresistive, and/or other suitable storage elements configured to store data persistently or semi-persistently.

The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the control circuitry 106 or the host device 108. The memory cells 122 can be arranged in rows 124 (e.g., each corresponding to a word line) and columns 126 (e.g., each corresponding to a bit line). In other embodiments, the memory cells 122 can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, regions, and memory units can vary, and can, in other embodiments, be larger or smaller in scale than shown in the illustrated examples. For example, in some embodiments, the memory device 100 can include only one memory unit 120. Alternatively, the memory device 100 can include two, three, four, eight, ten, or more (e.g., 16, 32, 64, or more) memory units 120. Although the memory units 120 are shown in FIG. 1 as including two memory regions 128 each, in other embodiments, each memory unit 120 can include one, three, four eight, or more (e.g., 16, 32, 64, 100, 128, 256 or more) memory regions.

In one embodiment, the control circuitry 106 can be provided on the same die as the main memory 102 (e.g., including command/address/clock input circuitry, decoders, voltage and timing generators, input/output circuitry, etc.). In another embodiment, the control circuitry 106 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 106 can include a processor configured to execute instructions stored in memory to perform various processes, logic flows, and routines for controlling operation of the memory device 100, including managing the main memory 102 and handling communications between the memory device 100 and the host device 108. In some embodiments, the embedded memory can include memory registers storing, e.g., memory pointers, fetched data, etc. In another embodiment of the present technology, a memory device may not include control circuitry, and may instead rely upon external control (e.g., provided by an external host, or by a processor or controller separate from the memory device).

In operation, the control circuitry 106 can directly write or otherwise program (e.g., erase) the various memory regions of the main memory 102. The control circuitry 106 communicates with the host device 108 over a host-device bus or interface 110. In some embodiments, the host device 108 and the control circuitry 106 can communicate over a dedicated memory bus such as a DRAM bus (e.g., a DDR4 bus, a DDR5 bus, a LPDDR4 bus, a LPDDR5 bus, etc.) or a NAND bus (e.g., an ONFI bus). In other embodiments, the host device 108 and the control circuitry 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the control circuitry 106. A request can include a command to read, write, erase, return information, and/or to perform a particular operation (e.g., a TRIM operation, a memory access operation such as a precharge operation, an activate operation, a wear-leveling operation, a garbage collection operation, etc.).

The host device 108 can be any one of a number of electronic devices capable of utilizing memory for the temporary or persistent storage of information, or a component thereof. For example, the host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio and/or video, a vehicle, an appliance, a toy, or any one of a number of other products. In one embodiment, the host device 108 may be connected directly to memory device 100, although in other embodiments, the host device 108 may be indirectly connected to memory device (e.g., over a networked connection or through intermediary devices).

According to an aspect of the present technology, the memory device 100 can experience degradation of the main memory 102 based on performing a large number of memory operations on the memory cells 122 thereof. In this regard, the reliability of the memory cells 122 may be reduced after exceeding a threshold number of memory operations (e.g., read operations, write operations, erase operations, activate operations, etc.). Accordingly, the control circuitry 106 of the memory device 100 can be configured to track a number of operations performed on the main memory 102 (e.g., by tracking a number of memory commands received from the host device 108). According to various embodiments of the present technology, the number of operations can be stored in a mode register of the control circuitry 106, in an embedded memory thereof, or even in the main memory 102. The control circuitry 106 can be configured to track a single value corresponding to a number of commands received at the memory device 100, or alternatively can be configured to track multiple values corresponding to the number of commands received at different subsets of the main memory 102 (e.g., tracking the number on a per bank basis, a per rank basis, a per channel basis, a per block basis, a per page basis, a per row basis, a per column basis, a per cell basis, etc.).

Although in one embodiment, the tracked value can simply be a count of a number of commands received at the memory device 100, in other embodiments the tracked value can also be based in part upon operating variables or environmental conditions as well. For example, the impact on the degradation of a memory media of an operation (e.g., a write operation, a read operation, an erase operation, an activate operation, etc.) can depend upon any one of a number of other factors, including an operating voltage, an operating temperature, and/or an up-time of the memory device 100 corresponding to when the command is received and/or the corresponding operation performed. Accordingly, the control circuitry 106 can be configured to update the tracked value by an amount weighted by one or more of the foregoing factors. In this regard, an operation that is performed while the memory device is above a first threshold temperature (e.g., a temperature above a normal operating temperature range) may correspond to an update (e.g., an addition) to the tracked value by an increment greater than 1 (e.g., by adding a value such as 1.1, 1.5, 2.0, etc. to the tracked value), while an operation that is performed while the memory device is below a second, lower threshold temperature (e.g., a temperature below the normal operating temperature range) may correspond to an update (e.g., an addition) to the tracked value by an increment less than 1 (e.g., by adding a value such as 0.1, 0.2, 0.5, etc. to the tracked value). Similarly, updates to the tracked value may be weighted by more than one factor (e.g., with an increased weighting on account of a sustained elevated temperature, and a further increased weighting on account of an average elevated voltage), to account for the different impact to the degradation of main memory 102 corresponding to different environmental conditions and operating variables.

In accordance with one embodiment of the present technology, the control circuitry 106 can be configured to output the tracked value to the host device 108 in response to an inquiry from the host device 108, or in connection with a start-up or a shut-down operation of the memory device 100. In accordance with another embodiment of the present technology, the control circuitry 106 can be configured to monitor the tracked value to determine whether it has exceeded a predetermined threshold and to trigger a remedial action if the predetermined threshold has been exceeded. For example, the predetermined threshold can correspond to a number of activate operations (e.g., opening a row address for access) that can be performed by memory device 100 before a wear-leveling operation should be performed. Accordingly, when the control circuitry 106 determines that the tracked value has exceeded the predetermined threshold, the control circuitry can perform or schedule a wear-leveling operation, and after performing the wear-leveling operation, can reset the tracked value (e.g., to 0).

In accordance with one aspect of the present technology, control circuitry 106 can be configured to schedule a wear-leveling operation for future performance during an interval in which a remedial action can be performed without unduly delaying the operation or degrading a performance characteristic of the memory device 100. In this regard, some memory devices, such as memory devices configured to communicate on a DRAM bus, may experience performance penalties associated with performing remedial actions (e.g., wear-leveling, garbage collection, etc.) without coordinating such activities with the connected host device 108. Accordingly, in one embodiment of the present technology, control circuitry 106 can be configured to wait for a command from host device 108 that permits the performance of a remedial action (e.g., a refresh command, including a self-refresh command, or the like) before performing the remedial action. In another embodiment of the present technology, control circuitry 106 can be configured to send a request to host device 108 to issue a command permitting the performance of a remedial action, and to delay the performance of the remedial action until the refresh command is received in response. In yet another embodiment, however, control circuitry 106 can be configured to perform a remedial action either without requesting such a refresh command from the host device 108, or without waiting to receive the refresh command from the host device 108 (e.g., when the host device 108 takes longer than a predetermined delay to issue the refresh command in response to the request).

In another embodiment, the remedial action performed in response to determining that the tracked value exceeds the predetermined threshold can include adjusting one or more operating characteristics of the memory device 100. For example, in response to such a determination, the control circuitry 106 can be configured to update (e.g., in a mode register, embedded memory, main memory 102, or the like) one or more sense amplifier weights, read window budgets, reference voltages, internally regulated voltage levels, sample timings, or some combination thereof.

According to one aspect of the present technology, the memory device 100 can also experience degradation of the main memory 102 based on storing the same data state in a memory cell 122 for an extended time (e.g., imprint). Tracking the duration of time experienced by the memory device 100, however, can be challenging, as the duration which can safely elapse before the continuous storage of a data state becomes detrimental may be many orders of magnitude greater than the duration of a clock cycle of the memory device 100. In this regard, a clock cycle of an example memory device 100 may represent a duration of between $1\times10^{-2}$ and $1\times10^{-9}$ seconds, or even less, while a duration which can elapse before the potential for imprint becomes significant may be between about $1\times10^{4}$ and $1\times10^{8}$ seconds (e.g., between about 6 and 17 orders of magnitude greater), or even more. To track or calculate a duration between about $1\times10^{4}$ and $1\times10^{8}$ seconds (e.g., or even more) based on a number of clock cycles with a duration of between $1\times10^{-2}$ and $1\times10^{-5}$ seconds (e.g., or even less) would require a cost-prohibitive (e.g., in power cost, die layout cost, materials cost, etc.) number of clock dividers, counter bits, mode registers, or the like.

To overcome this challenge, the control circuitry 106 of the memory device 100 can be configured to track a value corresponding to a number of commands that occur with a regularity or periodicity (e.g., an approximate rate) that is much larger than a clock cycle. In this regard, according to one embodiment of the present technology, the control circuitry 106 can be configured to track (e.g., in a mode register, embedded memory, or in main memory 102) a value corresponding to a number of refresh operations performed by the memory device 100. In operation, refresh commands can be provided by the host device 108 with an approximate periodicity of between about $1\times10^{-1}$ and $1\times10^{-7}$ seconds (e.g., between $10^{-2}$ and $10^{-5}$ seconds, between $10^{-3}$ and $10^{-6}$ seconds, between $10^{-4}$ and $10^{-7}$ seconds, etc.). Refresh operations may be performed in response to refresh commands received from the host, or may be performed by the memory device 100 independent of a command from the host (e.g., in accordance with an internal trigger such as a determined need to perform wear-leveling or some other remedial action, a detected environmental condition, etc.). Although refresh operations may not be performed by the memory device 100 with the regularity of a clock signal (e.g., the delay between refresh commands may not be uniform), by configuring a threshold number of refresh operations that are performed before a remedial action is performed to be a sufficiently low value, the adverse consequences (e.g., excessive duration between remedial actions) of this irregularity can be mitigated.

Although in one embodiment, the control circuitry 106 can be configured to track a count of refresh operations performed by the memory device 100, in other embodiments the tracked value can also be based in part upon operating variables or environmental conditions as well. For example, the imprint experienced by a memory media over a given duration can depend upon any one of a number of other factors, including an operating voltage and/or an operating temperature of the memory device 100 over that duration. Accordingly, the control circuitry 106 can be configured to update the tracked value by an amount weighted by one or more of the foregoing factors. In this regard, a duration that elapses (e.g., the duration between subsequent refresh operations) while the memory device is above a first threshold temperature (e.g., a temperature above a normal operating temperature range) may correspond to an update to the tracked value by an increment greater than 1 (e.g., by adding a value such as 1.1, 1.5, 2.0, etc. to the tracked value), while a duration that elapses while the memory device is below a second, lower threshold temperature (e.g., a temperature below the normal operating temperature range) may correspond to an update to the tracked value by an increment less than 1 (e.g., by adding a value such as 0.1, 0.2, 0.5, etc. to the tracked value). Similarly, updates to the tracked value may be weighted by more than one factor (e.g., with an increased weighting on account of an elevated temperature, and a further increased weighting on account of an elevated voltage), to account for the different impact to the imprint experienced by main memory 102 that can correspond to different environmental conditions and operating variables.

According to one aspect of the present technology, the control circuitry 106 can be configured to determine when the tracked value corresponding to the number of operations (e.g., refresh operations or some other operation with at least a semi-regular periodicity that is greater than that of the clock signal) that have been performed exceeds a predetermined threshold. When the control circuitry 106 determines that the predetermined threshold has been exceed, the control circuitry 106 can be configured to perform or schedule a remedial action (e.g., moving data between memory cells 122, refreshing charge on memory cells 122, inverting data states on memory cells 122, etc.) to address the potential for imprint and to reset the tracked number of operations (e.g., to 0). In one embodiment, the remedial action can be performed on all of main memory 102, although in another embodiment, the remedial action can be performed on a subset of main memory 102 (e.g., sequentially performing remedial actions on different subsets of main memory 102 each time the predetermined threshold is exceeded).

In another embodiment, the remedial action performed in response to determining that the tracked value exceeds the predetermined threshold can include adjusting one or more operating characteristics of the memory device 100. For example, in response to such a determination, the control circuitry 106 can be configured to update (e.g., in a mode register, embedded memory, main memory 102, or the like) one or more sense amplifier weights, read window budgets, reference voltages, sample timings, or some combination thereof.

In accordance with another aspect of the present technology, control circuitry 106 can be configured to determine a rate of degradation by, e.g., comparing a first tracked value corresponding to a number of received commands (e.g., activate commands) to a second tracked value corresponding to a number of operations with at least a semi-regular periodicity greater than that of a clock cycle (e.g., refresh operations). In this regard, control circuitry 106 can be configured to compare a determined rate of degradation (e.g., a rate at which commands that can cause memory media degradation are received over a sample period) to a predetermined threshold rate, and to take one or more remedial actions if the rate is determined to exceed the threshold. For example, the control circuitry 106 of a memory device 100 can be configured to adjust, in response to a determination that a rate of commands exceeds a predetermined threshold, one or more operating characteristics of the memory device 100. In this regard, in response to such a determination, the control circuitry 106 can be configured to update (e.g., in a mode register, embedded memory, main memory 102, or the like) one or more sense amplifier weights, read window budgets, reference voltages, sample timings, or some combination thereof.

Although in the foregoing example embodiments, a value corresponding to a number of activate commands has been described and illustrated in connection with tracking memory media degradation, and a value corresponding to a number of refresh operations has been described and illustrated in connection with the lapse of time at a memory device, other operations and commands can be tracked in addition or in lieu of these example commands. For example, read commands and/or operations, write commands and/or operations, erase commands and/or operations, status commands and/or operations, or other memory access commands and/or operations (e.g., precharge, wear-leveling, garbage collection, etc.) can be similarly tracked in other embodiments of the present technology. In this regard, one skilled in the art will readily appreciate that other commands or operations that can cause degradation to a memory media or be used to track the lapse of time can similarly be tracked by a memory device to determine whether a remedial action should be performed.

Figure 2:
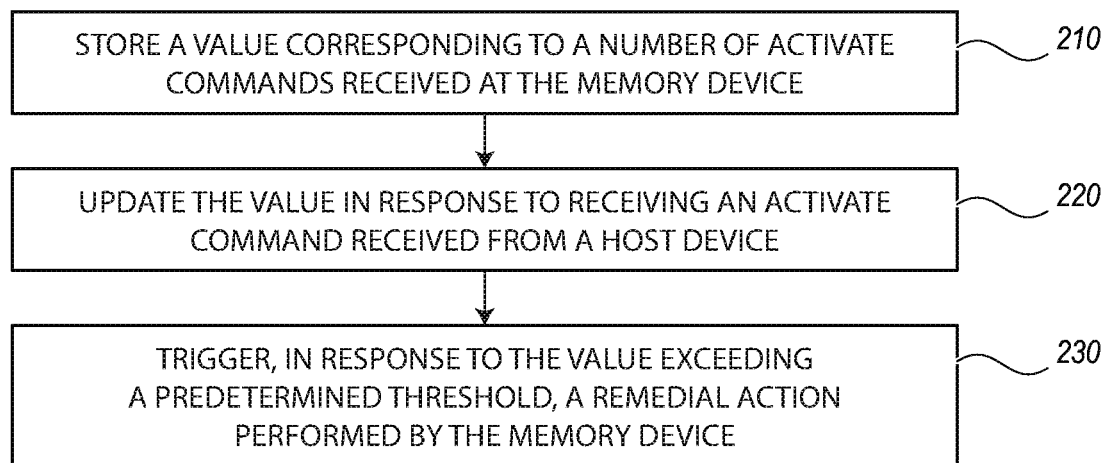
FIG. 2 is a flow chart illustrating a method of operating a memory device in accordance with an embodiment of the present technology.

FIG. 2 is a flow chart illustrating a method of operating a memory device in accordance with an embodiment of the present technology. The method includes storing a value corresponding to a number of activate commands received at the memory device (box 210) and updating the value in response to receiving an activate command received from a host device (box 220). In accordance with one aspect of the present technology, the storing and updating features of box 210 and 220 can be performed by the control circuitry 106 of memory device 100. The method further includes triggering, in response to the value exceeding a predetermined threshold, a remedial action performed by the memory device (box 230). In accordance with one aspect of the present technology, the triggering and performing a remedial action features of box 230 can be performed by the control circuitry 106 of memory device 100.

Figure 3:
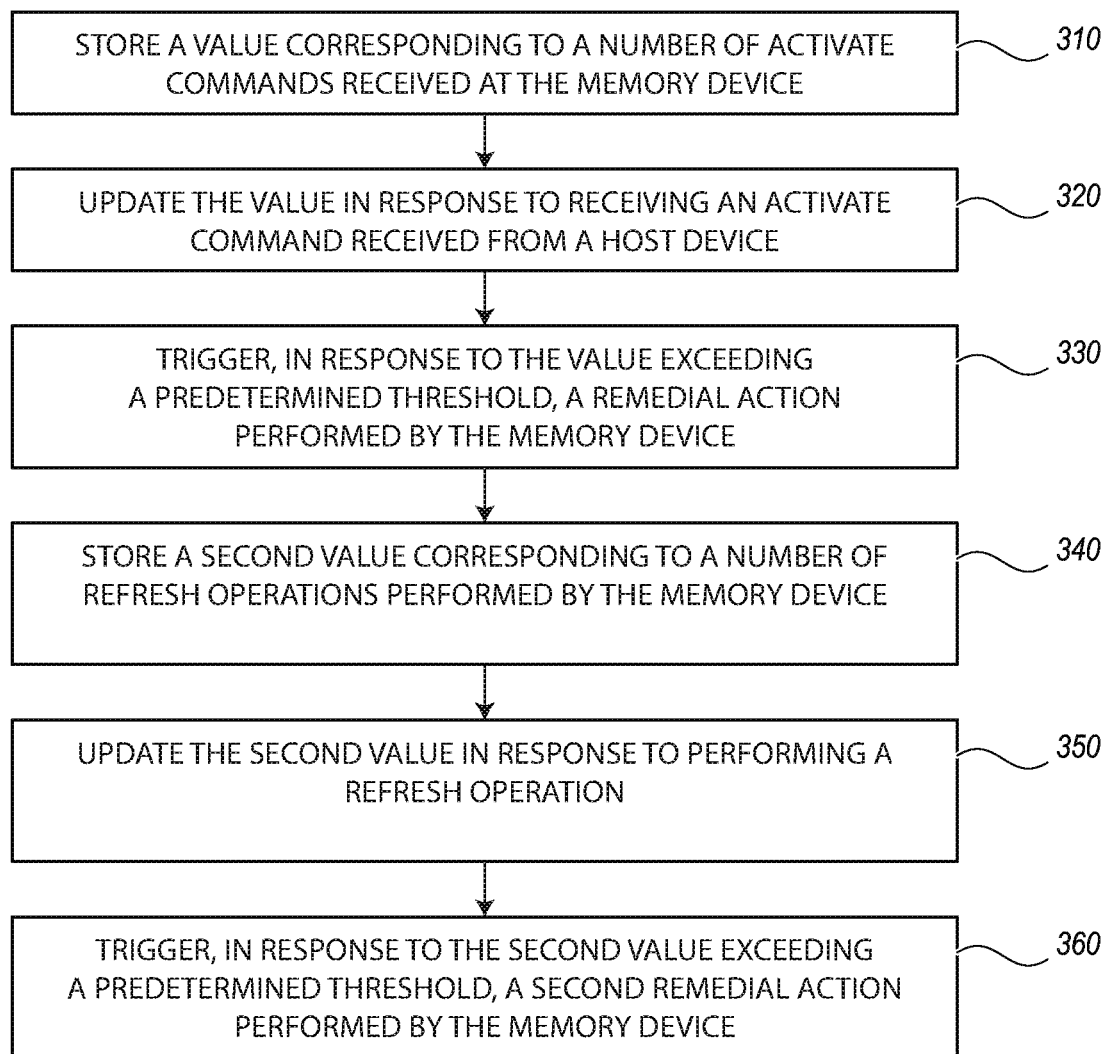
FIG. 3 is a flow chart illustrating a method of operating a memory device in accordance with an embodiment of the present technology.

FIG. 3 is a flow chart illustrating a method of operating a memory device in accordance with an embodiment of the present technology. The method includes storing a value corresponding to a number of activate commands received at the memory device (box 310) and updating the value in response to receiving an activate command received from a host device (box 320). In accordance with one aspect of the present technology, the storing and updating features of box 310 and 320 can be performed by the control circuitry 106 of memory device 100. The method further includes triggering, in response to the value exceeding a predetermined threshold, a remedial action performed by the memory device (box 330). In accordance with one aspect of the present technology, the triggering and performing a remedial action features of box 330 can be performed by the control circuitry 106 of memory device 100. The method further includes storing a second value corresponding to a number of refresh operations performed by the memory device (box 340) and updating the second value in response to performing a refresh operation (box 350). In accordance with one aspect of the present technology, the storing and updating features of box 340 and 350 can be performed by the control circuitry 106 of memory device 100. The method further includes triggering, in response to the second value exceeding a second predetermined threshold, a second remedial action performed by the memory device (box 360). In accordance with one aspect of the present technology, the triggering and performing a remedial action features of box 360 can be performed by the control circuitry 106 of memory device 100.

Figure 4:
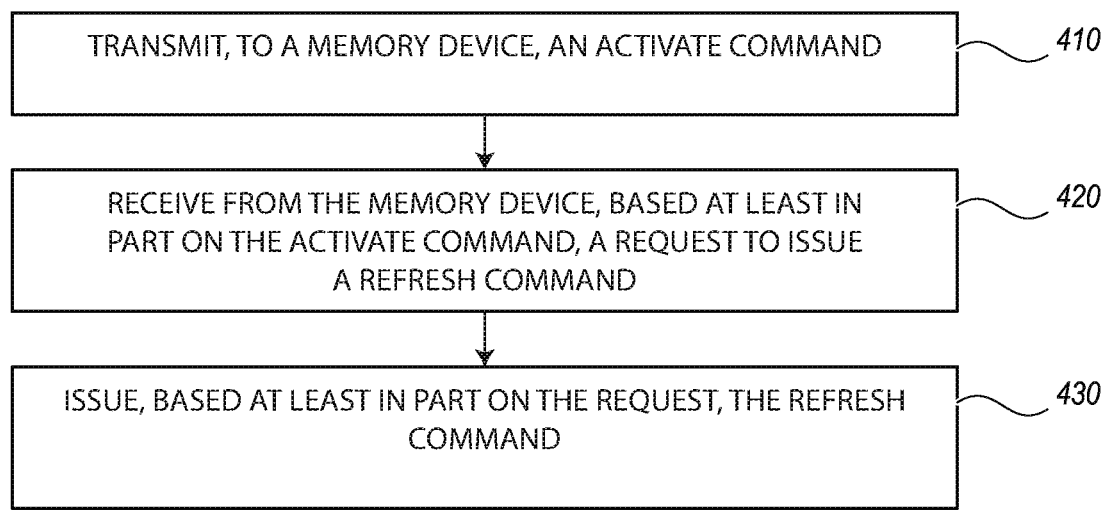
FIG. 4 is a flow chart illustrating a method of operating a memory system in accordance with an embodiment of the present technology.

FIG. 4 is a flow chart illustrating a method of operating a memory system in accordance with an embodiment of the present technology. The method includes transmitting, to a memory device, an activate command (box 410) and receiving from the memory device, based at least in part on the activate command, a request to issue a refresh command (box 420). The method further includes issuing, based at least in part on the request, the refresh command (box 430). In accordance with one aspect of the present technology, the transmitting, receiving, and issuing features of boxes 410-430 can be performed by the host device 108 of memory system 101.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A memory device, comprising:
    a non-volatile memory array; and
    control circuitry configured to:
        determine that a value corresponding to a number of periodically repeating commands received at the memory device has exceeded a predetermined threshold; and
        trigger, in response to the determination, a remedial action performed by the memory device.

2. The memory device of claim 1, wherein the periodically repeating commands are received at the memory device with a period greater than that of a clock cycle of the memory device.

3. The memory device of claim 1, wherein the periodically repeating commands are received at the memory device with a period at least an order of magnitude greater than that of a clock cycle of the memory device.

4. The memory device of claim 1, wherein the periodically repeating commands are refresh commands.

5. The memory device of claim 1, wherein the remedial action comprises requesting a refresh command from the host device and scheduling a further remedial action.

6. The memory device of claim 5, wherein the further remedial action comprises a wear leveling operation performed in response to receiving the requested refresh command.

7. The memory device of claim 1, wherein the remedial action comprises (i) scheduling a wear level operation to be performed in response to a subsequent refresh command received from the host device, (ii) performing a wear leveling operation without waiting to receive a refresh command from the host device, or (ii) updating a sense amplifier weight, a read window budget, a reference voltage, a sample timing, or a combination thereof.

8. The memory device of claim 1, wherein the value corresponds to both the number of periodically repeating commands received at the memory device and to a device temperature, a device voltage, a device up-time, or a combination thereof.

9. The memory device of claim 1, wherein the remedial action comprises resetting the value to zero.

10. The memory device of claim 1, wherein the value is a first value, the remedial action is a first remedial action, the predetermined threshold is a first predetermined threshold, and the control circuitry is further configured to:
    determine that a second value corresponding to a number of refresh operations performed by the memory device has exceeded a second predetermined threshold; and
    trigger, in response to the determination, a second remedial action performed by the memory device.

11. The memory device of claim 10, wherein the second remedial action comprises updating one or more of a sense amplifier weight, a read window budget, a reference voltage, a sample timing, or a combination thereof.

12. The memory device of claim 10, wherein the second remedial action comprises resetting the second value to zero.

13. The memory device of claim 1, wherein the non-volatile array comprises a flash array, a phase change array, a ferroelectric array, or a magnetoresistive array.

14. A method of operating a memory device including a memory array, the method comprising:
determining that a value corresponding to a number of periodically repeating commands received at the memory device has exceeded a predetermined threshold; and
triggering, in response to the determination, a remedial action performed by the memory device.

15. The method of claim 14, wherein the periodically repeating commands are received at the memory device with a period greater than that of a clock cycle of the memory device.

16. The method of claim 14, wherein the periodically repeating commands are received at the memory device with a period at least an order of magnitude greater than that of a clock cycle of the memory device.

17. The method of claim 14, wherein the periodically repeating commands are refresh commands.

18. The method of claim 14, wherein the remedial action comprises requesting a refresh command from the host device and scheduling a further remedial action.

19. The method of claim 18, wherein the further remedial action comprises a wear leveling operation performed in response to receiving the requested refresh command.

20. The method of claim 14, wherein the remedial action comprises (i) scheduling a wear level operation to be performed in response to a subsequent refresh command received from the host device, (ii) performing a wear leveling operation without waiting to receive a refresh command from the host device, or (iii) updating a sense amplifier weight, a read window budget, a reference voltage, a sample timing, or a combination thereof.

21. The method of claim 14, wherein updating the value comprises updating the value by an amount corresponding to a device temperature, a device voltage, a device up-time, or a combination thereof.

22. The method of claim 14, wherein the remedial action comprises resetting the value.

23. The method of claim 14, wherein the value is a first value, the remedial action is a first remedial action, the predetermined threshold is a first predetermined threshold, and further comprising:
determining that a second value corresponding to a number of refresh operations performed by the memory device has exceeded a second predetermined threshold; and
triggering, in response to the determination, a second remedial action performed by the memory device.

24. The method of claim 23, wherein the second remedial action comprises updating one or more of a sense amplifier weight, a read window budget, a reference voltage, a sample timing, or a combination thereof.

25. The method of claim 23, wherein the second remedial action comprises resetting the second value.

* * * * *